US009787183B2

(12) United States Patent
Chen (10) Patent No.: US 9,787,183 B2
(45) Date of Patent: Oct. 10, 2017

(54) DRIVER AND DRIVING CONTROL METHOD FOR POWER CONVERTER

(71) Applicant: uPI Semiconductor Corp., Hsinchu County (TW)

(72) Inventor: Wei-Ling Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 715 days.

(21) Appl. No.: 14/259,168

(22) Filed: Apr. 23, 2014

(65) Prior Publication Data

US 2015/0022170 A1 Jan. 22, 2015

(30) Foreign Application Priority Data

Jul. 19, 2013 (TW) .............................. 102126002 A (51) Int. Cl.
*H03K 3/00* (2006.01)
*H02M 3/158* (2006.01)
*H02M 1/00* (2006.01)

(52) U.S. Cl.
CPC .... *H02M 3/158* (2013.01); *H02M 2001/0006* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS

| 7,468,622 | B2 | 12/2008 | Bodano et al. |
| 7,592,831 | B2 | 9/2009 | Locatelli et al. |
| 7,889,002 | B2 | 2/2011 | Berkhout |
| 8,026,705 | B2 | 9/2011 | Chen et al. |
| 8,154,334 | B2 | 4/2012 | Wang |
| 2013/0002313 | A1* | 1/2013 | Hosokawa .......... H02M 3/1588 327/109 |
| 2013/0241621 | A1* | 9/2013 | Forghani-Zadeh ........................ H03K 17/08122 327/315 |

FOREIGN PATENT DOCUMENTS

| CN | 1043106 | 4/1999 |
| CN | 1914787 | 2/2007 |
| TW | 200919920 | 5/2009 |
| TW | 201249080 | 12/2012 |
| WO | 2006023912 | 3/2006 |

* cited by examiner

*Primary Examiner* — Long Nguyen
(74) *Attorney, Agent, or Firm* — Jianq Chyun IP Office (57) ABSTRACT

A driver and a driving control method for a power converter are provided. The driver includes a level shift circuit, a negative voltage generator and a first PMOS transistor. The level shift circuit provides an output signal, wherein the output signal has a first operation voltage and a second operation voltage. When the output signal received by the negative voltage generator is the first operation voltage, the negative voltage generator outputs the first operation voltage. When the output signal received by the negative voltage generator is the second operation voltage, the negative voltage generator generates and outputs a third operation voltage, and the third operation voltage is lower than the second operation voltage. A control terminal of the first PMOS transistor is coupled to an output terminal of the negative voltage generator. An output terminal of the first PMOS transistor provides a driving voltage.

18 Claims, 7 Drawing Sheets

```
┌─────────────────────────────────────┐
│ providing a level shift circuit, the level shift │
│ circuit providing an output signal, wherein the  │──S701
│ output signal has a first operation voltage      │
│ and a second operation voltage                   │
└─────────────────────────────────────┘
                    ↓
┌─────────────────────────────────────┐
│ providing a negative voltage generator, wherein  │
│ the negative voltage generator outputs the first │
│ operation voltage when the output signal         │
│ received by the negative voltage generator is the│
│ first operation voltage, and the negative voltage│──S703
│ generator outputs a third operation voltage      │
│ when the output signal received by the negative  │
│ voltage generator is the second operation        │
│ voltage, the third operation voltage being lower │
│ than the second operation voltage                │
└─────────────────────────────────────┘
                    ↓
┌─────────────────────────────────────┐
│ providing a PMOS transistor, wherein a control   │
│ terminal of the PMOS transistor is coupled to    │
│ an output terminal of the negative voltage       │──S705
│ generator, and an output terminal of the PMOS    │
│ transistor provides a driving voltage            │
└─────────────────────────────────────┘
                    ↓
┌─────────────────────────────────────┐
│ providing the driving voltage to a high side     │
│ driving unit, the high side driving unit receiving│──S707
│ the driving voltage for use in driving a high    │
│ side switch                                      │
└─────────────────────────────────────┘
```

FIG. 7

DRIVER AND DRIVING CONTROL METHOD FOR POWER CONVERTER

CROSS-REFERENCE TO RELATED APPLICATION

This application claims the priority benefit of Taiwan application Ser. No. 102126002, filed on Jul. 19, 2013. The entirety of the above-mentioned patent application is hereby incorporated by reference herein and made a part of this specification.

BACKGROUND OF THE INVENTION

Field of the Invention

The invention relates to a power converter, and more particularly, to a driver and a driving control method for a power converter.

Description of Related Art

Figure 1:
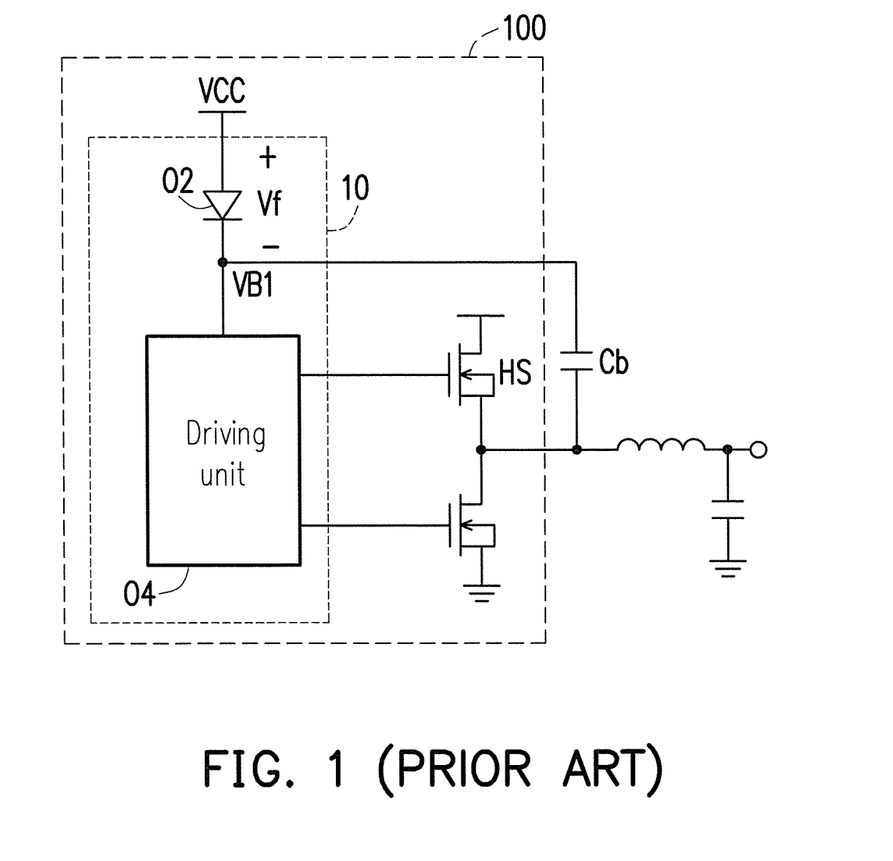
FIG. 1 is a schematic view of a part of a conventional power converter.

FIG. 1 is a schematic view of a part of a conventional power converter. Referring to FIG. 1. In a conventional power converter 100, a driver 10 uses the diode 02 to allow a current to flow unidirectionally, so that an operation voltage VCC charges a capacitor Cb external to the driver 10.

Generally speaking, a forward bias Vf of the diode 02 is 0.7 volt. Therefore, the maximum voltage value of the capacitor Cb is the operation voltage Vcc minus the forward bias Vf (0.7 volt). That is, the capacitor Cb may only be charged up to "VCC−Vf" volts. The maximum voltage value is the upper limit of a driving voltage VB1. The driving voltage VB1 is mainly used as a power supply of a driving unit 04, and the driving unit 04 is used for driving the high side switch HS.

In addition, the operation voltage VCC may be a battery voltage. Therefore, when the battery voltage is full voltage, the voltage value of the operation voltage VCC is the maximum. The operation voltage VCC is reduced with the energy consumption of the battery. Moreover, the driving voltage VB1 equals the operation voltage VCC minus a fixed forward voltage Vf. Thus, due to the reduction in the voltage value of the operation voltage VCC, the voltage value of the driving voltage VB1 is reduced as well. In the worst case, when the voltage value of the driving voltage VB1 is reduced, the on-resistance of the high side switch HS increases and the on-condition of the high side switch HS becomes non-obvious, which also leads to a decrease in the power conversion efficiency of the power converter 100.

SUMMARY OF THE INVENTION

In view of the above, a driver and a driving control method for a power converter are provided to solve the problem mentioned in the Description of Related Art.

A driver for a power converter is provided. The driver includes a level shift circuit, a negative voltage generator and a first PMOS transistor. The level shift circuit provides an output signal, wherein the output signal has a first operation voltage and a second operation voltage. The negative voltage generator is coupled to the level shift circuit. When the output signal received by the negative voltage generator is the first operation voltage, the negative voltage generator outputs the first operation voltage. When the output signal received by the negative voltage generator is the second operation voltage, the negative voltage generator generates and outputs a third operation voltage, wherein the third operation voltage is lower than the second operation voltage. The first PMOS transistor has a control terminal and an output terminal. The control terminal of the first PMOS transistor is coupled to an output terminal of the negative voltage generator. The output terminal of the first PMOS transistor provides a driving voltage.

According to an embodiment of the invention, the first operation voltage is greater than the second operation voltage, and the third operation voltage is between the second operation voltage and zero voltage. The driving voltage is identical with the first operation voltage.

According to an embodiment of the invention, the driver further includes a high side driving unit. The high side driving unit is coupled to the output terminal of the first PMOS transistor to receive the driving voltage for use in driving a high side switch.

According to an embodiment of the invention, the negative voltage generator includes a capacitor, a diode and an inverter. A first terminal of the capacitor is coupled to an output terminal of the level shift circuit. A first terminal of the diode is coupled to a second terminal of the capacitor, and a second terminal of the diode receives the second operation voltage. An input terminal of the inverter is coupled to the second terminal of the diode, an output terminal of the inverter serves as the output terminal of the negative voltage generator, a first power input terminal of the inverter is coupled to the output terminal of the level shift circuit and the first terminal of the capacitor, and the second power input terminal of the inverter is coupled to the first terminal of the diode.

According to an embodiment of the invention, when the negative voltage generator receives the second operation voltage from the level shift circuit, the third operation voltage is generated at a common node, wherein the common node is a coupling point of the diode and the capacitor.

According to an embodiment of the invention, a first NMOS transistor is configured as a diode, wherein a control terminal of the first NMOS transistor is coupled to a first terminal to serve as the first terminal of the diode, and a second terminal of the first NMOS transistor serves as the second terminal of the diode.

According to an embodiment of the invention, a second PMOS transistor and a second NMOS transistor are configured as the inverter, wherein a control terminal of the second PMOS transistor and a control terminal of the second NMOS transistor are coupled to serve as the input terminal of the inverter, a second terminal of the second PMOS transistor serves as a first power input terminal of the inverter, a second terminal of the second NMOS transistor serves as a second power input terminal of the inverter, and a first terminal of the second PMOS transistor and a first terminal of the second NMOS transistor are coupled to serve as the output terminal of the inverter.

According to an embodiment of the invention, when the negative voltage generator receives the second operation voltage from the level shift circuit, a relationship between a cross-voltage from an input terminal to the control terminal of the first PMOS transistor and the second operation voltage is shown in the equation below:

$$VSG=2\times(VCC-VSW)-Vf, \text{ and } VSG>VCC-VSW,$$

wherein VSG is the cross-voltage, VCC is a fourth operation voltage received by the input terminal of the first PMOS transistor, VSW is a second operation voltage, and Vf is a forward bias of the diode.

A driving control method for a power converter is further provided, including the following steps: providing a level shift circuit for providing an output signal, wherein the output signal has a first operation voltage and a second operation voltage; providing a negative voltage generator, wherein the negative voltage generator outputs the first operation voltage when the output signal received by the negative voltage generator is the first operation voltage, and the negative voltage generator outputs a third operation voltage when the output signal received by the negative voltage generator is the second operation voltage, the third operation voltage being lower than the second operation voltage; and providing a first PMOS transistor, wherein a control terminal of the first PMOS transistor is coupled to an output terminal of the negative voltage generator, and an output terminal of the first PMOS transistor provides a driving voltage.

According to an embodiment of the invention, the driving control method further includes the following steps: providing the driving voltage to a high side driving unit, and the high side driving unit receives the driving voltage for use in driving a high side switch.

Based on the above, the driver and driving control method for the power converter of the invention is able to generate the third operation voltage lower than the second operation voltage through the negative voltage generator. That is, the third operation voltage is a comparatively negative voltage than the second operation voltage, thereby increasing the cross-voltage from the input terminal to the control terminal of the first PMOS transistor to reduce an on-resistance of the first PMOS transistor. Therefore, compared with traditional operation means, the invention is able to obtain a larger driving voltage and thereby enhance a power supply for driving the high side driving unit.

It should be understood that the above general descriptions and the below embodiments are only exemplary and explanatory, and do not limit the scope of the invention.

BRIEF DESCRIPTION OF THE DRAWINGS

The accompanying drawings are part of this specification. The drawings illustrate exemplary embodiments and, together with the description in this specification, serve to explain the principles of the disclosure.

DESCRIPTION OF THE EMBODIMENTS

Descriptions of the invention are given with reference to the exemplary embodiments illustrated with accompanying drawings. In addition, elements/components with identical or similar reference numerals in the drawings and the embodiments represent identical or similar parts.

In the following embodiments, when an element is described as "connecting" or "coupled" to another element, the element may be connected or coupled directly to another element, or other elements may be present therebetween. The term "circuit" may represent at least one element or multiple elements, or elements actively and/or passively coupled together to provide suitable functions. The term "signal" may represent at least one current, voltage, load, temperature, data or other signals.

Figure 2:
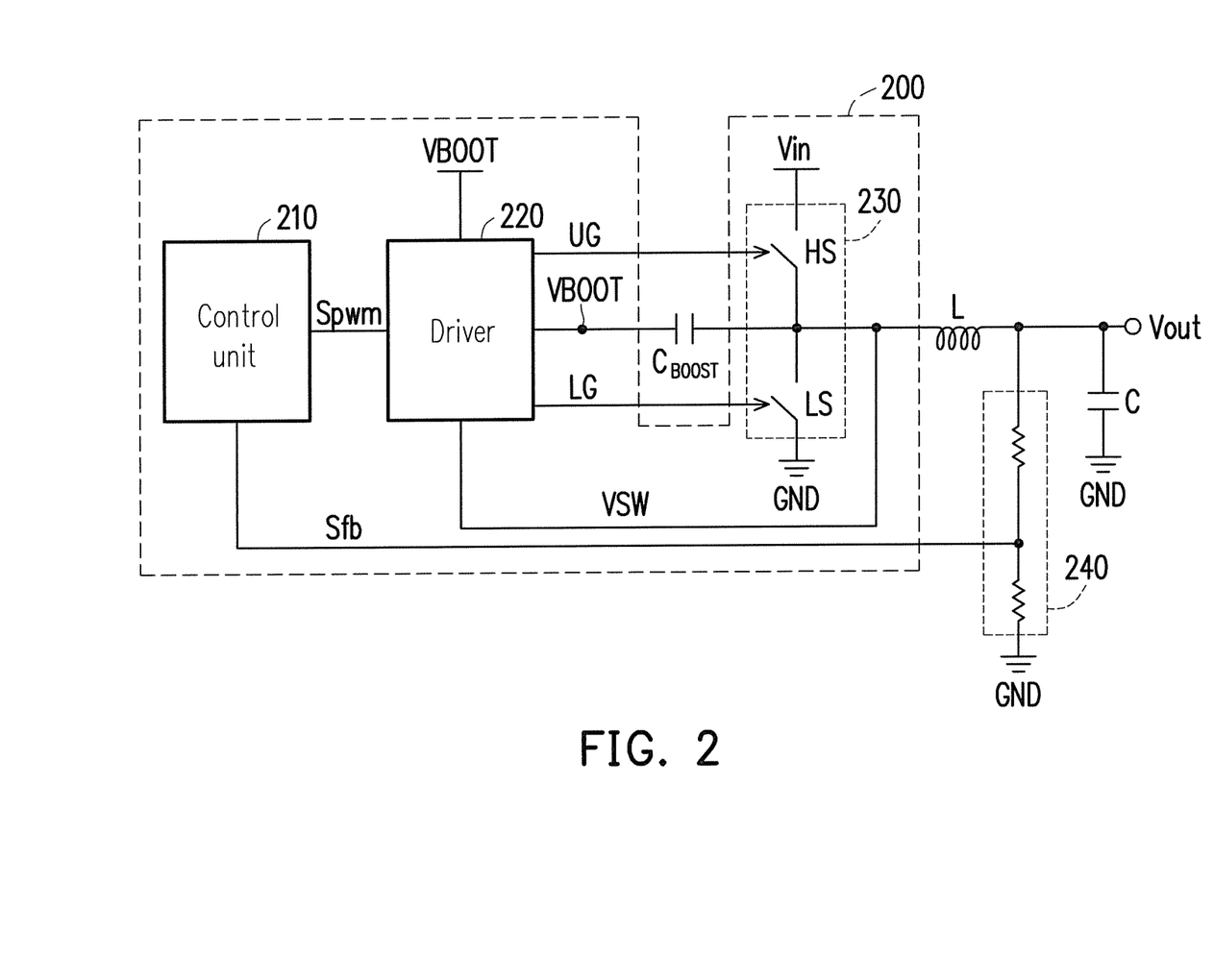
FIG. 2 is a schematic view of the structure of a power converter according to an embodiment of the invention.

FIG. 2 is a schematic view of the structure of a power converter according to an embodiment of the invention. Referring to FIG. 2, a power converter 200 includes a control circuit 210, a driver 220, an output stage 230 and a capacitor $C_{BOOST}$. A first terminal of a high side switch HS in the output stage 230 receives an input voltage Vin. A low side switch LS is coupled between a second terminal and a ground terminal GND of the high side switch HS. Outside elements of the power converter 200 include an inductor L, a capacitor C and a feedback circuit 240.

The driver 220 receives a first operation voltage VBOOT and a second operation voltage VSW. According to an embodiment of the invention, the first operation voltage VBOOT and the second operation voltage VSW may be power rails.

A control circuit 210 receives a feedback signal Sfb from the feedback circuit 240 and outputs a pulse-width modulated signal Spwm. The driver 220 generates a high side switch control signal UG and a low side switch control signal LG according to the pulse-width modulated signal Spwm, thereby controlling the high side switch HS and the low side switch LS respectively. The output stage 230 is used for performing DC-DC conversion to an input voltage Vin, so that the power converter 200 generates and outputs an output voltage Vout.

Figure 3:
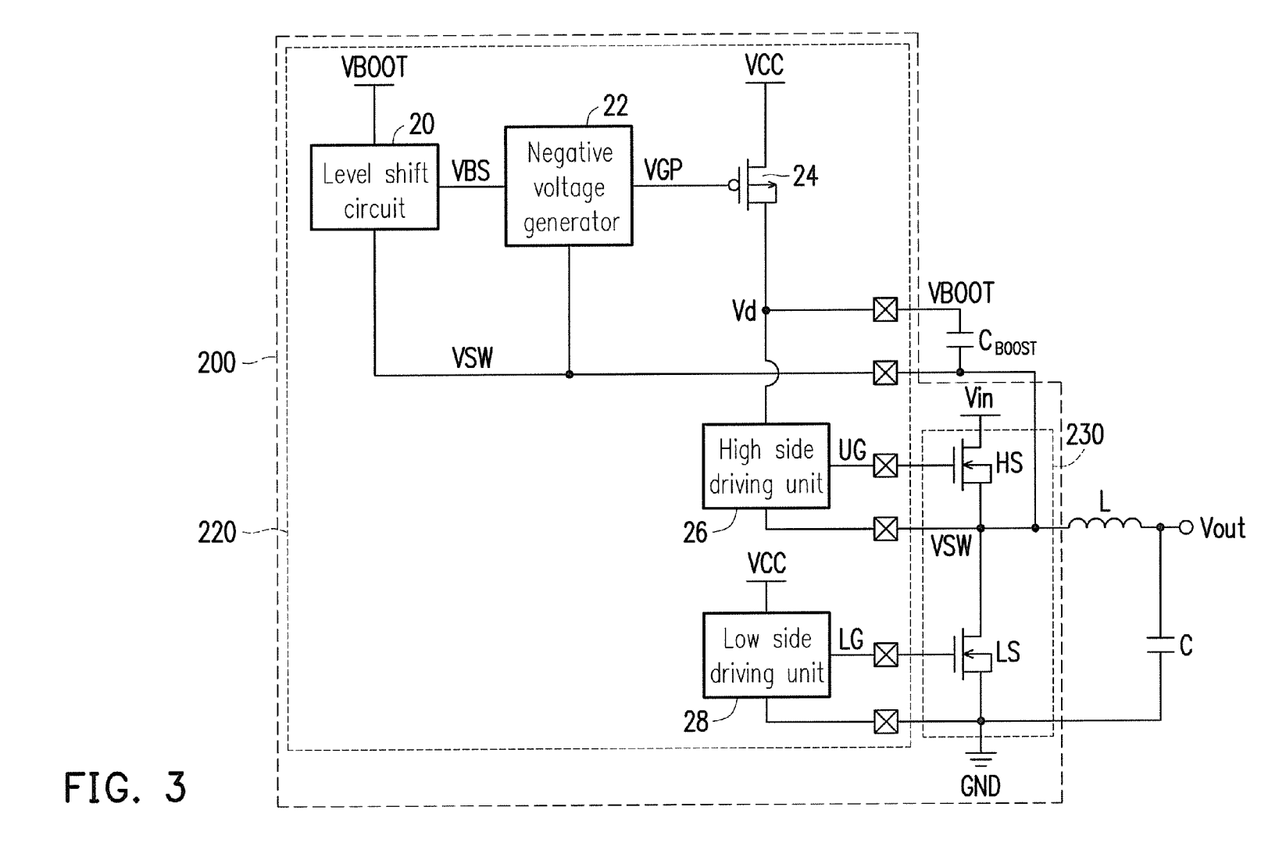
FIG. 3 is a schematic view of a circuit of a power converter according to an embodiment of the invention.

FIG. 3 is a schematic view of a circuit of a power converter according to an embodiment of the invention. Referring to FIG. 3, since FIG. 3 adopts a structure identical with that in FIG. 2, illustration of the control circuit 210 and the feedback circuit 240 is omitted from FIG. 3. The driver 220 includes a level shift circuit 20, a negative voltage generator 22 and a PMOS transistor 24.

The level shift circuit 20 provides an output signal VBS, wherein the output signal VBS has the first operation voltage VBOOT and the second operation voltage VSW. The negative voltage generator 22 is coupled to the level shift circuit 20. A control terminal of the PMOS transistor 24 is coupled to an output terminal of the negative voltage generator 22.

When an output signal VBS received by the negative voltage generator 22 is the first operation voltage VBOOT, an output signal VGP of the negative voltage generator 22 is the first operation voltage VBOOT. When the output signal VBS received by the negative voltage generator 22 is the second operation voltage VSW, the negative voltage generator 22 generates a third operation voltage (not shown), and thereby the output signal VGP of the negative voltage generator 22 is the third operation voltage. In addition, the third operation voltage needs to be lower than the second operation voltage VSW. That is, the negative voltage generator 22 is able to generate a voltage lower than the second operation voltage VSW.

In addition, the driver 220 further includes a high side driving unit 26 and a low side driving unit 28. The control terminal of the PMOS transistor 24 receives the output signal VGP from the negative voltage generator 22, an input terminal of the PMOS transistor 24 receives a fourth operation voltage VCC, and an output terminal of the PMOS transistor 24 generates and outputs a driving voltage Vd for driving. The driving voltage Vd may be used as a power supply for the high side driving unit 26, so that the high side driving unit 26 drives the high side switch HS.

It is worth noting that when the PMOS transistor 24 is on, the driving voltage Vd approximately equals the fourth operation voltage VCC. Therefore, compared with the conventional means in FIG. 1, the driving voltage Vd does not need to minus a fixed forward bias Vf from the fourth operation voltage VCC, and therefore the voltage value of the driving voltage Vd is higher. In addition, the first operation voltage VBOOT and the second operation voltage VSW are not zero value. The first operation voltage VBOOT is larger than the second operation voltage VSW, and the third operation voltage is between the second operation voltage VSW and zero voltage. The driving voltage Vd is identical with the first operation voltage VBOOT.

Figure 4:
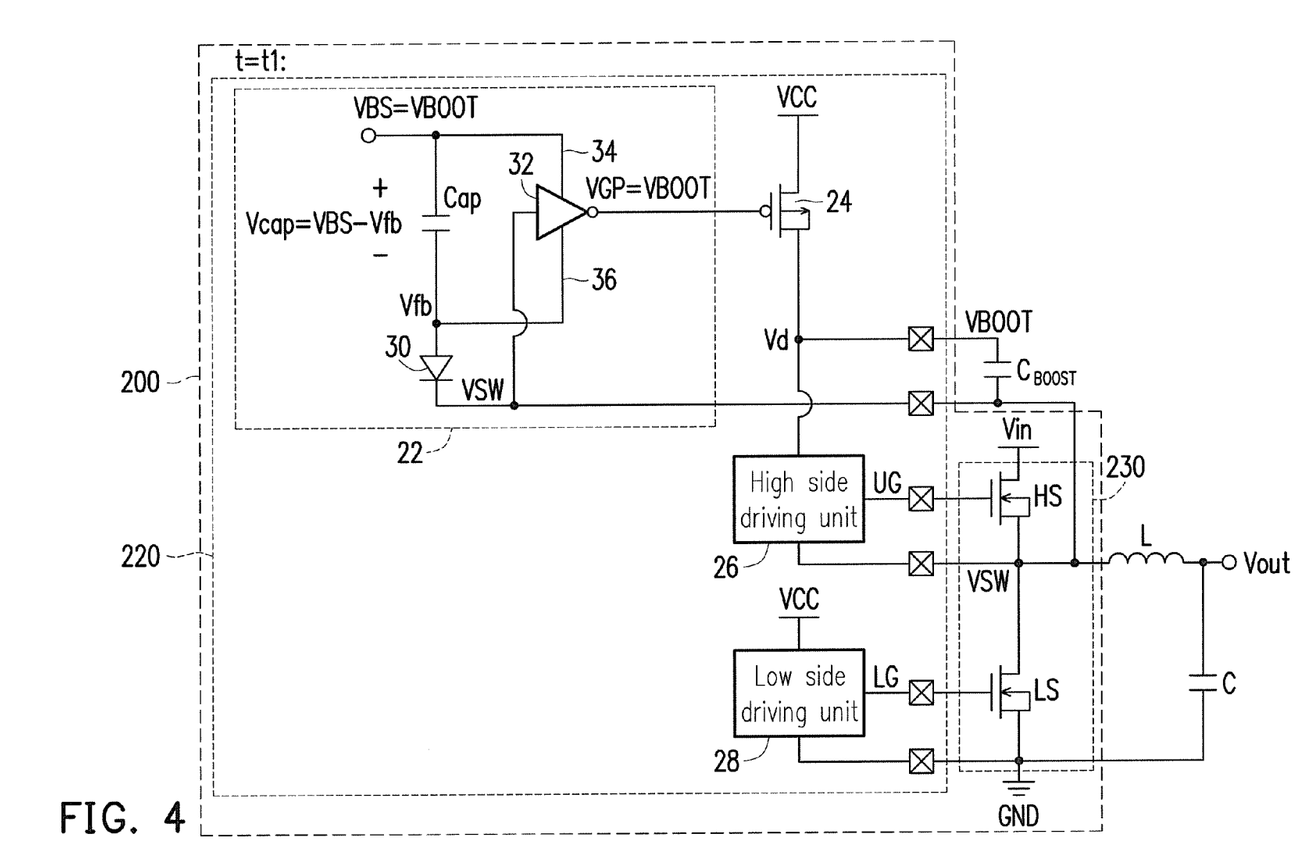
FIGS. 4 and 5 are schematic views of a circuit of a power converter according to an embodiment of the invention.
Figure 5:
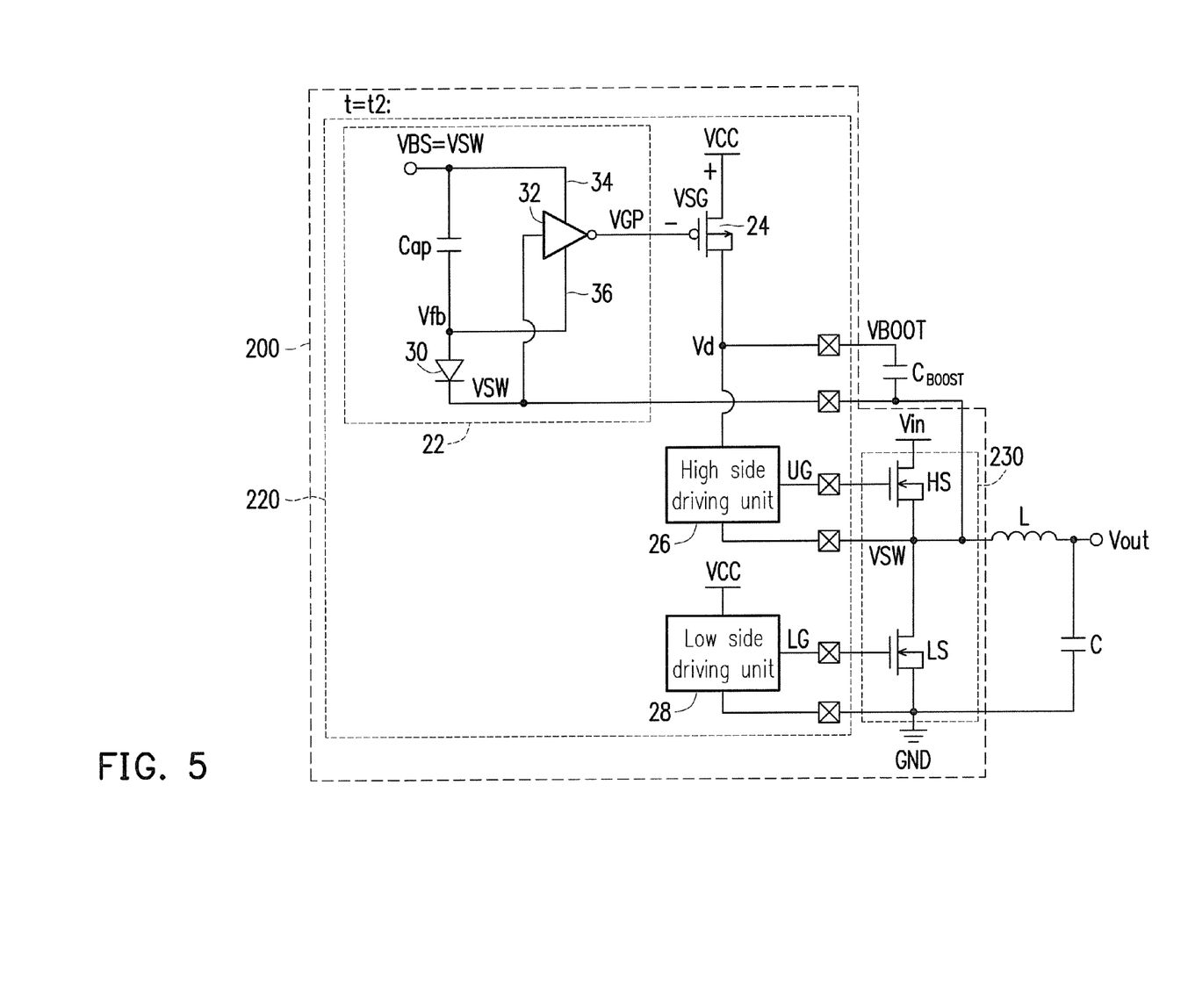

FIGS. 4 and 5 are schematic views of a circuit of a power converter according to an embodiment of the invention. FIGS. 4 and 5 are used for further illustrating the configuration of the negative voltage generator 22 in FIG. 3. Referring to FIGS. 3, 4 and 5, the negative voltage generator 22 includes a capacitor Cap, a diode 30 and an inverter 32. A first terminal of the capacitor Cap is coupled to the output terminal of the level shift circuit 20. A first terminal of the diode 30 is coupled to a second terminal of the capacitor Cap, and a second terminal of the same receives the second operation voltage VSW. An input terminal of the inverter 32 is coupled to a second terminal of the diode 30. An output terminal of the inverter 32 serves as the output terminal of the negative voltage generator 22. A first power input terminal 34 of the inverter 32 is coupled to the output terminal of the level shift circuit 20 and the first terminal of the capacitor Cap. A second power input terminal 36 of the inverter 32 is coupled to the second terminal of the diode 30.

The capacitor Cap is used for storing electrical charges for the negative voltage generator 22 to generate a comparatively negative voltage (the third operation voltage). The diode 30 may be used for defining the electrical charges stored in the capacitor Cap and the cross-voltage Vcap.

Referring to FIG. 4, at a first timing t1, if a timing t equals t1, the forward bias of the diode 30 is 0.7 volt. The output signal VBS of the level shift circuit 20 equals the first operation voltage VBOOT, wherein VBS=VBOOT>VSW. The output signal VGP of the inverter 32 equals the first operation voltage VBOOT. The cross-voltage Vcap of the capacitor Cap is shown in equation (1) below.

$$Vcap = VBS - Vfb \quad (1)$$
$$= VBOOT - (VSW + \text{forward bias})$$
$$= VBOOT - (VSW + 0.7).$$

Referring to FIG. 5, at a second timing t2 after the first timing t1, if the timing t equals t2, the output signal VBS of the level shift circuit 20 equals the second operation voltage VSW, wherein VBS=VSW. The capacitor Cap needs to obey conservation of charge, i.e. to maintain the characteristic of continuous voltage. Regarding the cross-voltage Vcap of the capacitor Cap, deduction is shown in equations (2) and (3) below.

$$Vcap = VBS - Vfb \quad (2)$$
$$\rightarrow VSW - Vfb = VBOOT - (VSW + 0.7)$$
$$\rightarrow Vfb = -VBOOT + 2VSW + 0.7.$$

$$Vcap = VBS - Vfb \quad (3)$$
$$= VSW - (-VBOOT + 2VSW + 0.7)$$
$$= VBOOT - VSW - 0.7 > 0.7 \text{ (volt)}.$$

When the timing t equals t2, the output signal VGP of the inverter 32 equals the third operation voltage (Vfb). The third operation voltage (Vfb) is generated at a common node, and the common node is a coupling point of the diode 30 and the capacitor Cap. Based on the conservation of charge, the voltage Vfb is lower than the second operation voltage VSW. In comparative terms, the third operation voltage (Vfb) is a comparatively negative voltage than the second operation voltage. At this point, the relationship between the cross-voltage VSG from the input terminal to the control terminal final of the PMOS transistor 24 and the second operation voltage is shown in equation (4) below.

$$VSG = VCC - VGP = VCC - Vfb \quad (4)$$
$$\rightarrow VSG = VCC - (-VBOOT + 2VSW + 0.7),$$
If $VBOOT$ approximately equals $VCC$,
then $VSG = VCC - (-VCC + 2VSW + 0.7)$
$$= 2(VCC - VSW) - 0.7 > VCC - VSW.$$

It is learned from equation (5) below that if the on-resistance (Ron) in the PMOS transistor 24 is to be reduced, the size of the PMOS transistor 24 needs to be enlarged [gate width/gate length (W/L)]. However, such a practice increases the area of the integrated circuit of the driver 220. In addition, since the area of the integrated circuit needs to be compliant with standard specification, the size of the PMOS transistor 24 in the allocation of area will be restricted. Thus, it is not suggested in the practices of the invention to enlarge the size of the PMOS transistor 24.

$$Ron = \frac{1}{\mu \times Cox \times \frac{W}{L} \times (VSG - |Vth|)}, \quad (5)$$

wherein μ is a carrier mobility, Cox is a unit capacitance of a gate oxide layer, W is a gate width of a MOS transistor, L is a gate length of a MOS transistor, and Vth is a threshold voltage.

It may be learned from the illustration of FIG. 5 that with the increase of the cross-voltage VSG, the on-resistance (Ron) and the cross-voltage VSG have an inverse ratio. Therefore, the on-resistance of the PMOS transistor 24 may be decreased.

In addition, compared to the practice of simply enlarging the size of the PMOS transistor, the driver 220 of the invention is able to conserve the circuit area of the PMOS transistor 24.

Figure 6:
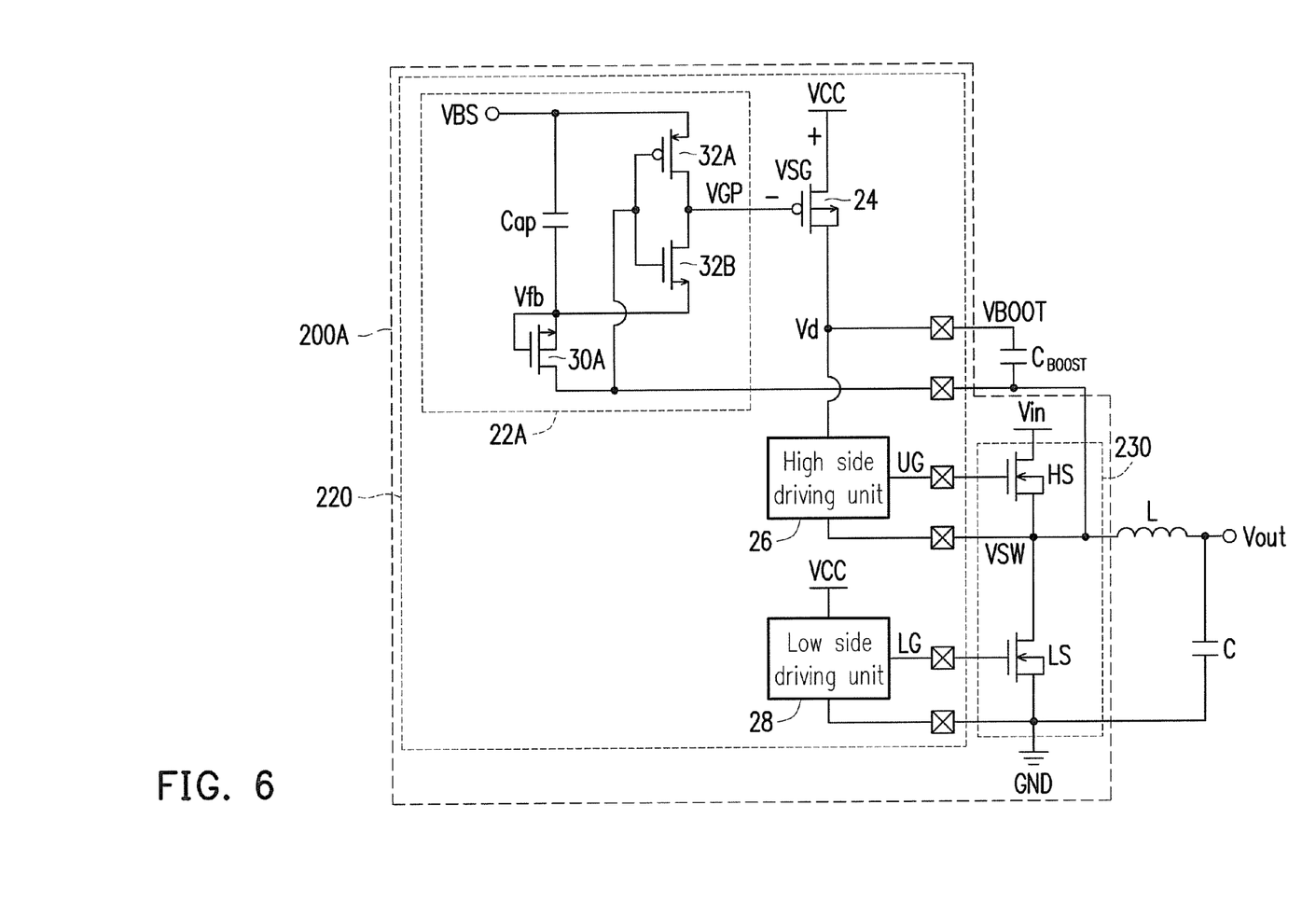
FIG. 6 is a schematic view of a circuit of a power converter according to an embodiment of the invention.

FIG. 6 is a schematic view of a circuit of a power converter according to an embodiment of the invention. Referring to FIG. 6, the power converter 200A is similar to the power converter 200, and therefore description about a similar element may be referred to in the above without repetition herein. Further description about the negative voltage generator 22A in FIG. 6 is further provided herein. In FIG. 6, a NMOS transistor 30A is configured as a diode. For example, a control terminal of the NMOS transistor 30A is coupled to the first terminal to serve as the first terminal of the diode, and a second terminal of the NMOS transistor serves as the second terminal of the diode.

In addition, a PMOS transistor 32A and a NMOS transistor 32B are configured as an inverter. For example, a control terminal of the PMOS transistor 32A and a control terminal of the NMOS transistor 32B are coupled to serve as the input terminal of the inverter, a second terminal of the PMOS transistor 32A serves as the first power input terminal of the inverter, the second terminal of the second NMOS transistor serves as the second power input terminal of the second NMOS transistor, and a first terminal of the PMOS transistor 32A is coupled to a first terminal of the NMOS transistor 32B to serve as the output terminal of the inverter.

Figure 7:
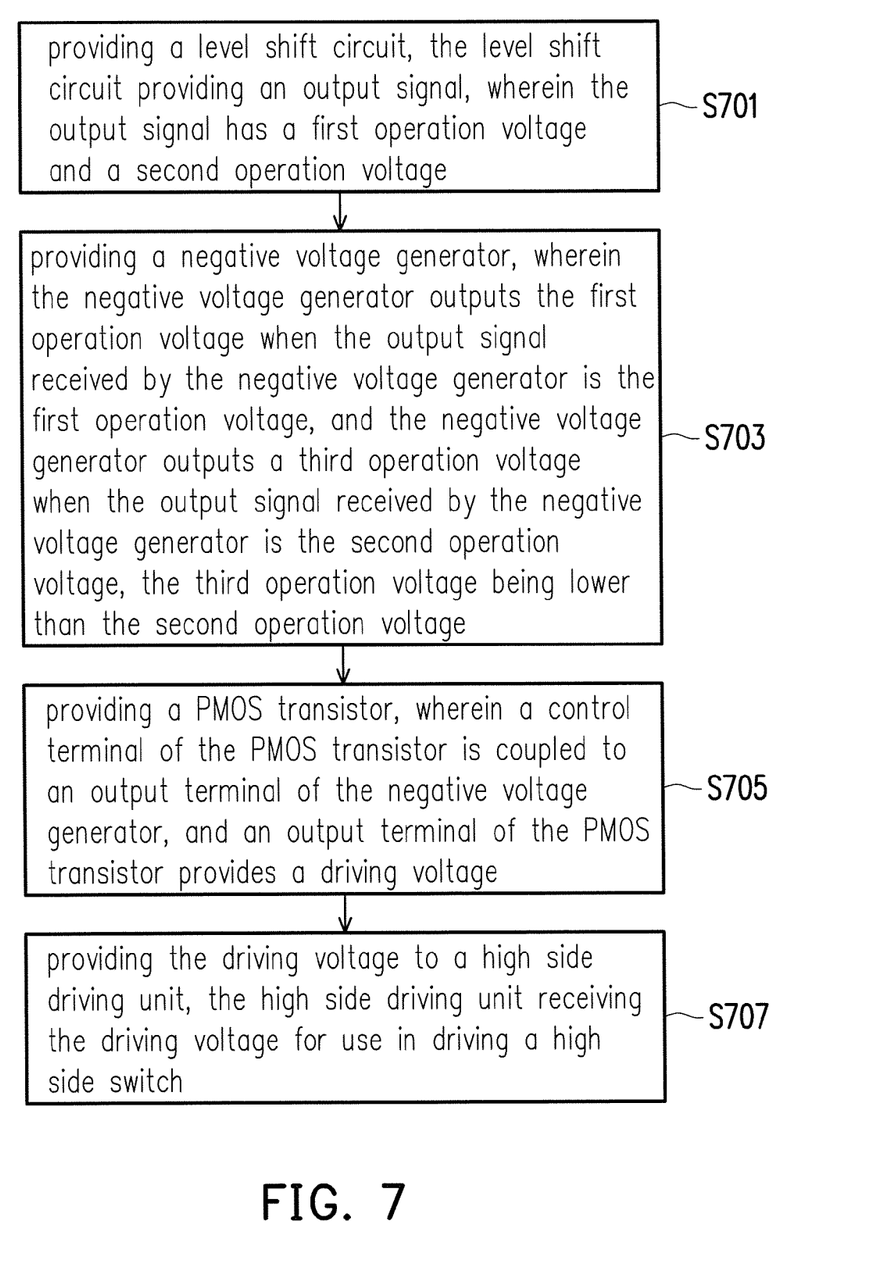
FIG. 7 is a flow chart illustrating a driving control method for a power converter according to an embodiment of the invention.

Based on the descriptions disclosed in the exemplary embodiments aforementioned, a general driving control method for a power converter is integrated in the following. More specifically, FIG. 7 is a flow chart illustrating a driving control method for a power converter according to an embodiment of the invention. Referring to both FIGS. 3 and 7, the driving control method of the embodiment may include the following steps.

As shown in step S701, providing a level shift circuit 20 that provides an output signal VBS, wherein the output signal has a first operation voltage VBOOT and a second operation voltage VSW.

Next, as shown in step S703, providing a negative voltage generator 22. When the output signal VBS received by the negative voltage generator 22 is the first operation voltage VBOOT, the negative voltage generator 22 outputs the first operation voltage VBOOT, and when the output signal VBS received by the negative voltage generator 22 is the second operation voltage VSW, the negative voltage generator 22 outputs a third operation voltage, wherein the third operation voltage is lower than the second operation voltage VSW.

As shown in step S705, providing a PMOS transistor 24 having a control terminal coupled to an output terminal of the negative voltage generator 22, wherein an output terminal of the PMOS transistor 24 provides a driving voltage Vd.

Then, as shown in step S707, supplying a driving voltage Vd to a high side driving unit 26, wherein the high side driving unit 26 receives the driving voltage Vd and uses the same to drive a high side switch HS.

In light of the above, the driver and driving control method for the power converter are able to generate a third operation voltage lower than the second operation voltage through the negative voltage generator. Since the third operation voltage is a comparatively negative voltage than the second operation voltage, the invention is able to obtain a larger driving voltage than traditional ways, thereby enhancing the power supply for driving the high side driving unit. On the other hand, when the cross-voltage VSG from the input terminal to the control terminal of the PMOS transistor 24, the on-resistance of the PMOS transistor 24 may be reduced.

Although the invention has been described with reference to the above embodiments, it will be apparent to one of ordinary skill in the art that modifications to the described embodiments may be made without departing from the spirit and scope of the invention. Accordingly, the scope of the invention will be defined by the attached claims and not by the above detailed descriptions.

In addition, any of the embodiments or any of the claims of the invention does not need to achieve all of the advantages or features disclosed by the present invention. Moreover, the abstract and the headings are merely used to aid in searches of patent files and are not intended to limit the scope of the claims of the invention.

What is claimed is:

1. A driver for a power converter, comprising:
   a level shift circuit, providing an output signal, wherein the output signal has a first operation voltage and a second operation voltage;
   a negative voltage generator, coupled to the level shift circuit, wherein the negative voltage generator outputs the first operation voltage when the output signal received by the negative voltage generator is the first operation voltage, and the negative voltage generator generates and outputs a third operation voltage when the output signal received by the negative voltage generator is the second operation voltage, the third operation voltage being lower than the second operation voltage; and
   a first PMOS transistor, having a control terminal and an output terminal, wherein the control terminal of the first PMOS transistor is coupled to an output terminal of the negative voltage generator, and the output terminal of the first PMOS transistor provides a driving voltage.

2. The driver as claimed in claim 1, wherein the first operation voltage is larger than the second operation voltage.

3. The driver as claimed in claim 2, wherein the third operation voltage is between the second operation voltage and zero voltage.

4. The driver as claimed in claim 1, wherein the driving voltage is identical with the first operation voltage.

5. The driver as claimed in claim 1, wherein the driver further comprises:
   a high side driving unit, coupled to the output terminal of the first PMOS transistor to receive the driving voltage for use in driving a high side switch.

6. The driver as claimed in claim 1, wherein the negative voltage generator further comprises:
   a capacitor having a first terminal coupled to an output terminal of the level shift circuit;
   a diode, having a first terminal coupled to a second terminal of the capacitor and a second terminal receiving the second operation voltage; and
   an inverter, having an input terminal coupled to the second terminal of the diode, an output terminal serving as an output terminal of the negative voltage generator, a first power input terminal coupled to the output terminal of the level shift circuit and a first terminal of the capacitor, and a second power input terminal coupled to the first terminal of the diode.

7. The driver as claimed in claim 6, wherein the third operation voltage is generated in a common node when the negative voltage generator receives the second operation voltage from the level shift circuit, the common node being a coupling point of the diode and the capacitor.

8. The driver as claimed in claim 6, wherein a first NMOS transistor is configured as the diode, a control terminal of the first NMOS transistor being coupled to a first terminal to serve as the first terminal of the diode, and a second terminal of the first NMOS transistor serving as the second terminal of the diode.

9. The driver as claimed in claim 6, wherein a second PMOS transistor and a second NMOS transistor is configured as the inverter, a control terminal of the second PMOS transistor being coupled to a control terminal of the second NMOS transistor to serve as the input terminal of the inverter, a second terminal of the second PMOS transistor serving as the first power input terminal of the inverter, a second terminal of the second NMOS transistor serving as the second power input terminal of the inverter, and a first terminal of the second PMOS transistor being coupled to a first terminal of the second NMOS transistor to serve as the output terminal of the inverter.

10. The driver as claimed in claim 6, wherein when the negative voltage generator receives the second operation voltage from the level shift circuit, a relationship between a cross-voltage from an input terminal to the control terminal of the first PMOS transistor and the second operation voltage is shown in the equation below:

$$VSG=2\times(VCC-VSW)-Vf, \text{ and } VSG>VCC-VSW,$$

wherein VSG is the cross-voltage, VCC is a fourth operation voltage received by the input terminal of the first PMOS transistor, VSW is the second operation voltage, and Vf is a forward bias of the diode.

11. A driving control method for a power converter, comprising:
   providing a level shift circuit, the level shift circuit providing an output signal, wherein the output signal has a first operation voltage and a second operation voltage;
   providing a negative voltage generator, wherein the negative voltage generator outputs the first operation voltage when the output signal received by the negative voltage generator is the first operation voltage, and the negative voltage generator generates and outputs a third operation voltage when the output signal received by the negative voltage generator is the second operation voltage, the third operation voltage being lower than the second operation voltage; and
   providing a first PMOS transistor, wherein a control terminal of the first PMOS transistor is coupled to an output terminal of the negative voltage generator, and an output terminal of the first PMOS transistor provides a driving voltage.

12. The driving control method as claimed in claim 11, wherein the first operation voltage is larger than the second operation voltage.

13. The driving control method as claimed in claim 12, wherein the third operation voltage is between the second operation voltage and zero voltage.

14. The driving control method as claimed in claim 11, wherein the driving voltage is identical with the first operation voltage.

15. The power control method as claimed in claim 11, further comprising:
   providing the driving voltage to a high side driving unit, the high side driving unit receiving the driving voltage for use in driving a high side switch.

16. The driving control method as claimed in claim 11, wherein the negative voltage generator comprises:
   a capacitor having a first terminal coupled to an output terminal of the level shift circuit;
   a diode, having a first terminal coupled to a second terminal of the capacitor and a second terminal receiving the second operation voltage; and
   an inverter, having an input terminal coupled to the second terminal of the diode, an output terminal serving as an output terminal of the negative voltage generator, a first power input terminal coupled to the output terminal of the level shift circuit and the first terminal of the capacitor, and a second power input terminal coupled to the first terminal of the diode.

17. The driving control method as claimed in claim 16, wherein the third operation voltage is generated in a common node when the negative voltage generator receives the second operation voltage from the level shift circuit, the common node being a coupling point of the diode and the capacitor.

18. The driving control method as claimed in claim 16, wherein when the negative voltage generator receives the second operation voltage from the level shift circuit, a relationship between a cross-voltage from an input terminal to the control terminal of the first PMOS transistor and the second operation voltage is shown in the equation below:

$$VSG=2\times(VCC-VSW)-Vf, \text{ and } VSG>VCC-VSW,$$

wherein VSG is the cross-voltage, VCC is a fourth operation voltage received by the input terminal of the PMOS transistor, VSW is the second operation voltage, and Vf is a forward bias of the diode.

* * * * *